United States Patent [19]
Craft

[11] Patent Number: 6,070,179
[45] Date of Patent: May 30, 2000

[54] METHOD AND SYSTEM FOR COMPRESSING UNICODE DATA WITHIN A DATA PROCESSING SYSTEM

[75] Inventor: David John Craft, Austin, Tex.

[73] Assignee: International Business Machines Corporation, Armonk, N.Y.

[21] Appl. No.: 09/026,677

[22] Filed: Feb. 20, 1998

[51] Int. Cl.[7] .................................................. G06F 15/00
[52] U.S. Cl. .......................................................... 708/203
[58] Field of Search .............................. 708/203; 341/55, 341/67, 90, 50

[56] References Cited

U.S. PATENT DOCUMENTS

| | | | |
|---|---|---|---|
| 4,701,745 | 10/1987 | Waterworth | 341/67 |
| 5,682,158 | 10/1997 | Edberg et al. | 341/90 |
| 5,889,481 | 3/1999 | Okada | 341/50 |
| 5,929,792 | 7/1999 | Herriot | 341/55 |

*Primary Examiner*—Tan V. Mai
*Attorney, Agent, or Firm*—Casimer K. Salys; Anthony P. Ng; Andrew J. Dillon

[57] ABSTRACT

A method for compressing data within a data processing system is disclosed. Each unit of data is at least two bytes. As each byte from a data stream is received, a determination is made as to whether or not an identical data byte occurs at a pre-selected interval within a group of bytes already received. In response to a determination that an identical data byte occurs at a pre-selected interval within a group of bytes already received, only a portion of a subsequent unit of data from the data stream is passed to an output.

18 Claims, 4 Drawing Sheets

INPUT TO PRE-PROCESSOR
22 00 23 00 27 00 31 00 47 00 89 01 34 01 22 01 95 01 38 01 76 01 84 01

OUTPUT TO COMPRESSOR
22 23 27 31 47 | 00 89 01 34 01 22 01 | 95 38 76 84

ACTIVE | INACTIVE | ACTIVE

Fig. 3b

INPUT TO PRE-PROCESSOR
22 03 23 03 27 03 31 03 00 03 89 03 34 03 22 03 95 03 38 03 76 03 84 03

OUTPUT TO COMPRESSOR
22 23 27 31 | 00 03 89 34 22 95 38 76 84

ACTIVE | INACTIVE | ACTIVE

Fig. 3c

INPUT TO PRE-PROCESSOR
22 05 23 05 05 31 05 44 05 00 01 34 01 22 01 95 01 38 01 76 01 84 01

OUTPUT TO COMPRESSOR
22 23 05 31 44 00 00 01 34 01 22 01 95 38 76 84

ACTIVE — INACTIVE — ACTIVE

Fig. 3d

INPUT TO PRE-PROCESSOR
22 05 23 05 05 31 05 44 05 00 01 00 01 22 01 95 01 38 01 76 01 84 01

OUTPUT TO COMPRESSOR
22 23 05 31 44 00 00 01 00 01 22 01 95 38 76 84

ACTIVE — INACTIVE — ACTIVE

METHOD AND SYSTEM FOR COMPRESSING UNICODE DATA WITHIN A DATA PROCESSING SYSTEM

BACKGROUND OF THE INVENTION

1. Technical Field

The present invention relates to a method and system for data compression in general, and in particular to a method and system for compressing data within a data processing system. Still more particularly, the present invention relates to a method and system for compressing UNICODE data within a data processing system.

2. Description of the Prior Art

Electronic information processing and transmission are currently experiencing dramatic growth internationally. Consequently, there is a growing need for internationalization and standardization of information coding formats. The well-known ASCII symbol set, which can only accommodate 256 possible byte symbols, is incapable of accommodating even a small fraction of all the characters and symbols in the world as a whole. Just taking financial documents originated from the United Kingdom as an example, most of them demand an ability to retrieve and display the Pound Sterling symbol (£), which is not found in the standard ASCII symbol set. Thus, it is evident that a much larger symbol set is required to handle documents that are in Russian, Greek, Arabic, and various Asian languages.

One attempt at symbol coding standardization entails retaining ASCII as the basic operating symbol set and providing a country-specific code page to the ASCII symbol set for each computer system. This approach, however, only works well with computer systems that are intended to be utilized within a few countries; and it will become increasingly less effective as documents and electronic commerce are becoming more international.

A new approach in solving the above-mentioned problem is by utilizing a new symbol set known as UNICODE. In essence, the UNICODE symbol set solves the problem of code depletion by allocating two bytes per symbol. For many of the more popular languages, one of the two bytes of a UNICODE symbol serves as a code page specifier and the other byte designates a member of the particular code page set. As a result, data within a document tends to be comprised of byte-pairs, with one byte of each byte-pair being the same. This can be illustrated by the following example of a 36-byte fragment of data. The fragment is first listed as it appears on an ASCII text printer, and then in a hexadecimal format:

Cormack Horspool 1985 dynamic Markov
436F726D 61636B20 486F7273 706F6F6C 20313938 35206479 6E616D69 63204D61 726B6F76

In UNICODE, the same 36-byte fragment of data will look like:

Note that twice as many bytes of data are required by UNICODE. Note also that the two hexadecimal formats differ only in that the UNICODE has an additional "00" byte inserted after each ASCII byte. This "00" character typically prints as a blank space on most computer systems, which appears as "gaps" in the text when output by an ASCII text printer as shown above.

Most adaptive compression algorithms, such as Lempel-Ziv 1, typically operate on symbols which are usually one byte in size. The UNICODE symbol set, which is essentially a two-byte symbol set, can prove quite detrimental to those types of data compression algorithms. Although a better compression ratio can be achieved with a larger size of UNICODE document, the final compression result of the UNICODE version is still worse than that of an ASCII version, even though the information content within each of the two versions is still virtually the same. Consequently, it would be desirable to provide an improved method for compressing UNICODE data within a data processing system such that the compression ratio achieved for a UNICODE version is comparable with that obtained from an ASCII version of the same document.

SUMMARY OF THE INVENTION

In view of the foregoing, it is therefore an object of the present invention to provide an improved method and system for data compression.

It is another object of the present invention to provide an improved method and system for compressing data within a data processing system.

It is yet another object of the present invention to provide an improved method and system for compressing UNICODE data within a data processing system.

In accordance with the method and system of the present invention, each unit of data is at least two bytes. As each byte from a data stream is received, a determination is made as to whether or not an identical data occurs at a pre-selected interval within a group of bytes already received. In response to a determination that an identical data occurs at a pre-selected interval within a group of bytes already received, only a part of a subsequent unit of data from the data stream is passed to an output.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

C o r m a c k H o r s p o o l   1 9 8 5   d y n a m i c M a r k o v
43006F00 72006D00 61006300 6B002000 48006F00 72007300 70006F00 6F006C00 20003100 39003800 35002000
64007900 6E006100 6D006900 63002000 4D006100 72006B00 6F007600

FIGS. 3a–3d are a set of pre-processor input and output data stream examples that illustrate UNICODE data compression in accordance with the present invention.

DETAILED DESCRIPTION OF A PREFERRED EMBODIMENT

In the following description, numerous specific details are set forth, such as numbers of bits, attributes, etc., in order to provide a thorough understanding of the present invention. However, those skilled in the art will appreciate that these details are implementation specific and that the present invention may be practiced using alternative designs.

Figure 1:
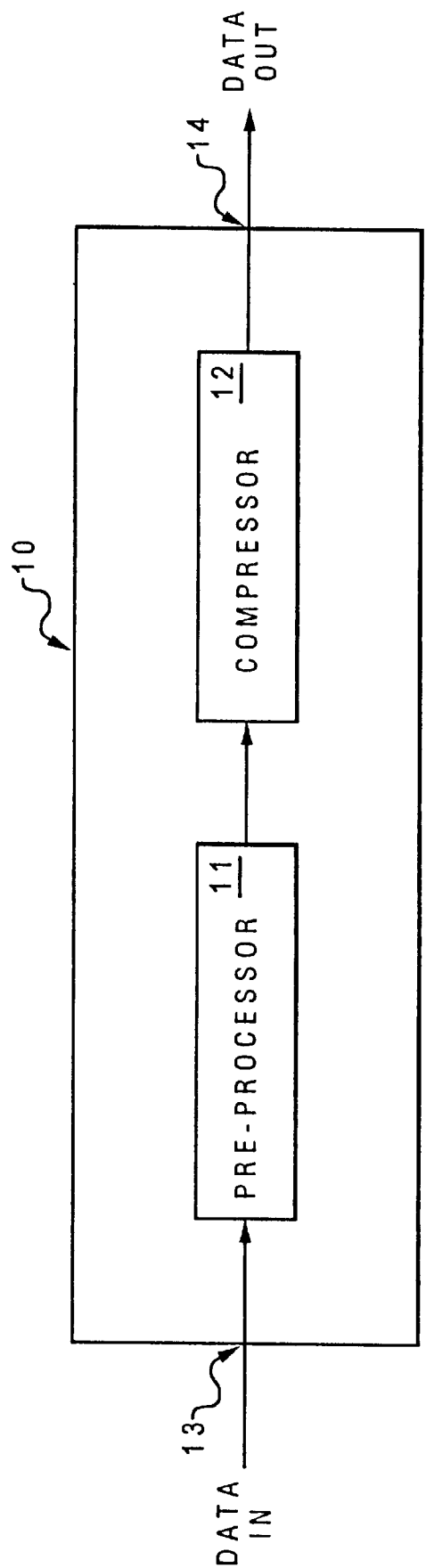
FIG. 1 is a block diagram of a data compression system having a pre-processor in which a preferred embodiment of the present invention is applicable.

Referring now to the drawings and in particular to FIG. 1, there is illustrated a block diagram of a data compression system having a pre-processor to which a preferred embodiment of the present invention is applicable. As shown, data compression system 10 comprises a pre-processor 11 and a compressor 12. Although any type of well-known data compression algorithm can be implemented within compressor 12, a Lempel-Ziv 1 adaptive compression algorithm is the preferred compression algorithm for the present invention.

During operation, pre-processor 11 first receives an incoming UNICODE data stream from data input 13. After the incoming data is pre-processed within pre-processor 11, the pre-processed data is fed to compressor 12, which compresses the pre-processed data. Finally, the compressed data is sent out via data output 14.

As a preferred embodiment of the present invention, pre-processor 11 continually detects an even-ordered predecessor identity condition such as follows, in an incoming UNICODE data stream:

byte N=byte (N−2)=byte (N−4) . . .

where byte N is the current incoming data byte, byte (N−1) is the previous incoming data byte, and byte (N−2) is another incoming data byte preceding that, and so on. Until the even-order predecessor identity condition is met, pre-processor 11 will be in an inactive mode and simply passes each input data byte unchanged to compressor 12. Once a data sequence satisfying the above even-order predecessor identity condition appears, pre-processor 11 enters an active mode and begins to examine input data bytes in pairs. For each data byte-pair (i.e., one UNICODE character), pre-processor 11 checks that the even-order predecessor identity condition is still maintained, and if so, pre-processor 11 passes only the odd member of the data byte-pair on to compressor 12. In effect, a stream of UNICODE characters is replaced by a preprocessed stream of data including one half the number of bytes, as long as the other UNICODE character byte remains the same.

Certainly, some UNICODE documents may require more than 256 characters; thus, the even-ordered predecessor identity condition may not be sustained for a large number of consecutive bytes in a data stream derived from such UNICODE documents. However, for many, if not most, UNICODE documents, one byte of the UNICODE byte-pairs is essentially constant throughout. As a preferred embodiment, the threshold number of matching bytes for the even-ordered predecessor identity condition to be true is three, though a smaller or larger number may also be acceptable. When the threshold number is three, pre-processor 11 must retain the preceding four data bytes of input, and evaluate whether pre-processor 11 should remain in the active mode after processing each character.

Pre-processor 11 can be forced to exit the active mode of operation by a relatively unique incoming UNICODE character that breaks the even-ordered predecessor identity condition. For example, a "00" character (i.e., an ASCII NULL character) can be conveniently utilized for such purpose, because the "00" character simply does not occur very often. Even if the "00" character happens to become part of the UNICODE character set, the simplest solution is still to force pre-processor 11 to exit the active mode on a "00" character, and re-enter the active mode once the requisite even-ordered predecessor identity condition is re-established.

For pre-processor 11, active mode character processing involves receiving two data bytes, encoding them as a single output byte if the even-ordered predecessor identity condition is sustained, or encoding the byte-pair as a "00" character followed by the two data bytes otherwise. If pre-processor 11 is not in the active mode, character processing involves only input of a single data byte, then output of the same data byte to compressor 12.

Figure 2:
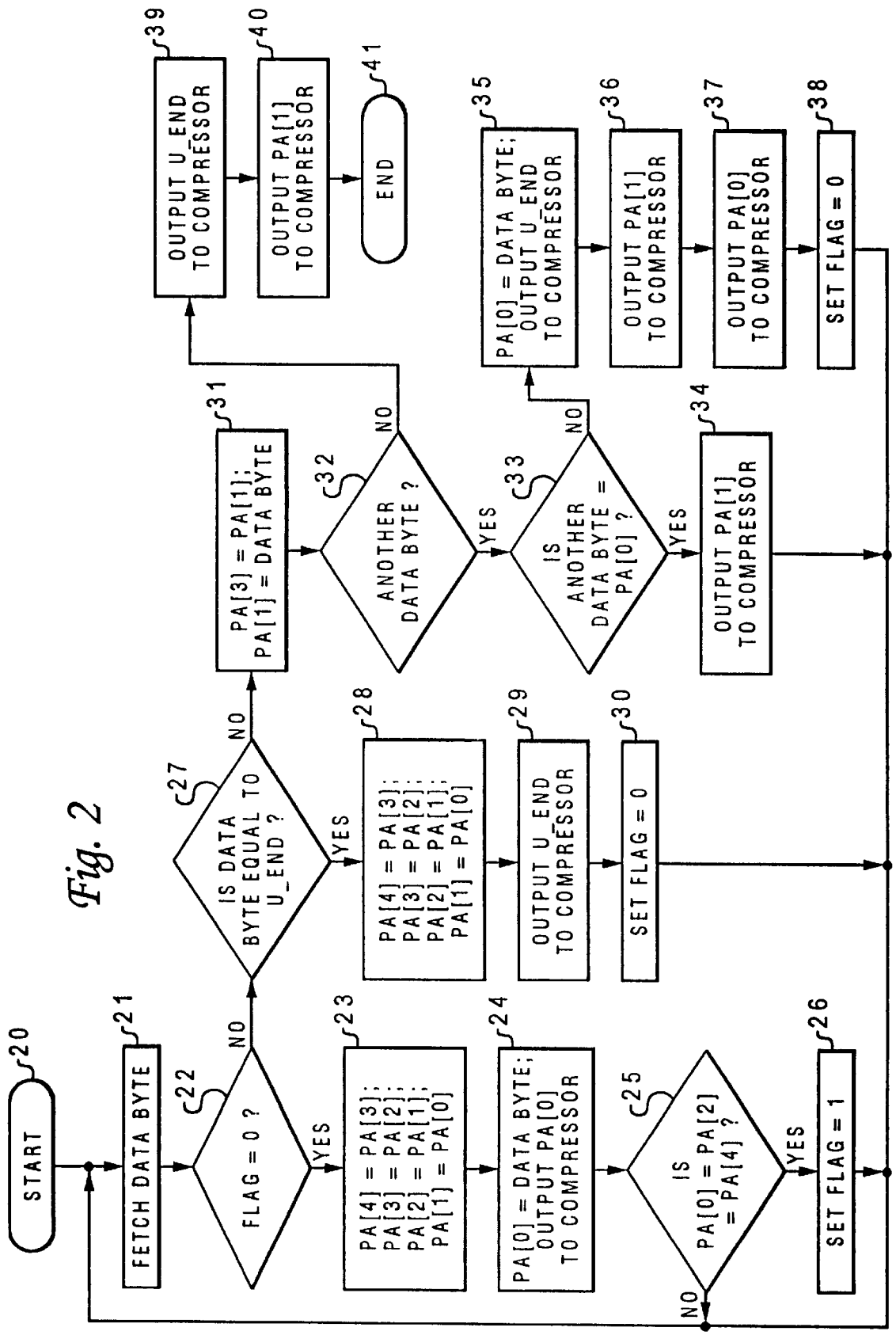
FIG. 2 is a high-level logic flow diagram of a method for compressing UNICODE data, in accordance with a preferred embodiment of the present invention.

With reference now to FIG. 2, there is illustrated a high-level logic flow diagram of a method for compressing UNICODE data in accordance with a preferred embodiment of the present invention. The resources utilized in the preferred embodiment include a FLAG bit and a pre-processor array PA[ ]. The FLAG bit is utilized for mode indication, i.e. active mode or inactive mode. Pre-processor array PA[ ] preferably has five locations, PA[0] through PA[4], which each hold one byte of data. This allows the threshold value of three to be used to establish the even-ordered predecessor identicality condition that determines the state of the FLAG bit.

Starting at block 20, the FLAG bit and the values of PA[0] through PA[4] are set to 0. After a data byte is fetched as shown in block 21, a determination is made as to whether or not the FLAG bit is equal to zero, as depicted in block 22. If the FLAG bit is equal to zero, the value of PA[4] is set to the value of PA[3]; the value of PA[3] is set to the value of PA[2]; the value of PA[2] is set to the value of PA[1]; and the value of PA[1] is set to the value of PA[0], as illustrated in block 23. Then, the value of PA[0] is set to the value of the data byte, and the value of PA[0] is output to a compressor, as shown in block 24. Next, a determination is made as to whether or not the value within PA[0], PA[2] and PA[4] are identical, as depicted in block 25. If the values within PA[0], PA[2] and PA[4] are identical, then the FLAG bit is set to 1, as depicted in block 26. The process then returns back to block 21 to fetch another data byte.

However, if a determination is made at block 22 that the FLAG bit does not equal zero, another determination is made as to whether or not the data byte is equal to an U_END character, as shown in block 27. The U_END character is preferably a "00" as mentioned previously, though any predefined byte character may also be acceptable. If the data byte is equal to the U_END character, then the value of PA[4] is set to the value of PA[3]; the value of PA[3] is set to the value of PA[2]; the value of PA[2] is set to the value of PA[1]; and the value of PA[1] is set to the value of PA[0], as depicted in block 28. Then, the U_END character is output to the compressor, as illustrated in block 29. Next, the FLAG bit is set to 0, as shown in block 30, and the process returns back to block 21.

Otherwise, if a determination is made at block 27 that the data byte is not equal to the U_END character, the value of PA[3] is set to the value of PA[1] and the value of PA[1] is set to the value of the data byte, as shown in block 31. A determination is then made as to whether or not there is another data byte that follows, as depicted in block 32. If yes, another determination is made as to whether the following data byte is equal to the value of PA[0], as illustrated in block 33. If the following data byte is equal to the value of PA[0], then the value in PA[1] is output to the compressor, as shown in block 34. Otherwise, if the following data byte is not identical to the value of PA[0], then the value of PA[0] is set to the value of the data byte. In addition, the U_END character, the value of PA[1], and the value of PA[0] are output to the compressor, as depicted at blocks 35, 36, and 37, respectively. The FLAG bit is then set to 0, as illustrated in block 38, and the process returns back to block 21.

However, in response to a determination at block 32 that there are no more data bytes, the U_END character and the value of PA[1] are output to the compressor, as shown in blocks 39 and 40, respectively. Finally, the process exits at block 41.

Referring now to FIGS. 3a–3d, there are depicted a set of pre-processor input and output data stream examples to further illustrate UNICODE data compression in accordance with a preferred embodiment of the present invention. In FIG. 3a, there is illustrated an example of input data stream in the Little-Endian format XX UU, where the low-order (mostly varying) byte XX comes first for each UNICODE character. Little-Endian data format is utilized, for example, by the Intel™ x86 architecture. As shown, there is a transition from the UNICODE character XX 00 to the UNICODE character XX 01. This transition is assumed to occur while the pre-processor is in the active mode and encoding XX 00 characters from an input data stream. A 00 output byte from the preprocessor initiates a change to an inactive mode, but after six bytes, identity of the three even-ordered predecessor values re-establishes the active mode once more. The active mode is sustained for the rest of the data stream.

Next in FIG. 3b, a UNICODE 00 03 character is received while the pre-processor is in the active mode and processing a series of XX 03 UNICODE characters. Notice that although the 00 03 UNICODE character is part of the current UNICODE character set, the occurrence of the "00" byte sill triggers a transition to the inactive mode. However, because the even-ordered predecessor identity condition is still retained, an active mode encoding is resumed immediately after the 00 03 UNICODE character is received.

In FIG. 3c, the pre-processor exits from the active mode to the inactive mode after receiving the XX 05 UNICODE character. A "00" byte character follows. After encoding the XX 01 UNICODE character, the pre-processor returns back to the active mode. FIG. 3d illustrates the fact that during an inactive mode, a "00" byte character is encoded by the pre-processor as exactly that.

As has been described, the present invention provides an improved method for compressing UNICODE data within a data processing system. Any adaptive data compression algorithm can be utilized in conjunction with the present invention, though a general-purpose type of algorithms such as Lempel-Ziv 1 has been found to be most effective when processing documents encoded under the new UNICODE character encoding standard.

An exemplary implementation of the present invention can be an external pre-processor/post-processor coupled to a hardware compressor/decompressor. The silicon chip area required for such implementation is expected to extremely small (under 0.5 mm$^2$). The pre-processor/post-processor operation should be automatic and transparent such that no significant overhead will be introduced into the data stream. The present invention can also be cascaded with other types of pre-processor/post-processor, including a run pre-processor/post-processor.

It is also important to note that the method of the present invention is capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for compressing data within a data processing system, wherein each unit of said data is at least two bytes, said method comprising the steps of:

receiving a data stream;

as each byte from said data stream is received, determining whether or not an identical data byte occurs at a pre-selected interval within a plurality of bytes already received; and in response to a determination that an identical data byte occurs at a pre-selected interval within a plurality of bytes already received, passing only a portion of a subsequent unit of data from said data stream to an output.

2. The method for compressing data according to claim 1, wherein said each unit of said data is a UNICODE byte-pair.

3. The method for compressing data according to claim 1, wherein said determining step further includes a step of determining whether or not an identical data byte occurs at an even-ordered predecessor location within a plurality of bytes already received.

4. The method for compressing data according to claim 3, wherein said determining step further includes a step of determining whether or not an identical data byte occurs at three or more even-ordered predecessor locations.

5. The method for compressing data according to claim 1, wherein said method further includes a step of exiting said passing step when a preselected exit character is encountered within said data stream.

6. The method for compressing data according to claim 1, wherein said method further includes a step of passing each byte of a subsequent data unit to an output, in response to a determination that an identical data byte does not occur at a pre-selected interval within a plurality of bytes already received.

7. A data compressing system capable of compressing data, wherein each unit of said data is at least two bytes, said data compressing system comprising:

means for receiving a data stream;

means for determining whether or not an identical data byte occurs at a pre-selected interval within a plurality of bytes already received, as each byte from said data stream is received; and means for passing only a portion of a subsequent unit of data from said data stream to an output, in response to a determination that an identical data byte occurs at a pre-selected interval within a plurality of bytes already received.

8. The data compressing system according to claim 7, wherein said each unit of said data is a UNICODE byte-pair.

9. The data compressing system according to claim 7, wherein said determining means further includes a means for determining whether or not an identical data byte occurs at an even-ordered predecessor location within a plurality of bytes already received.

10. The data compressing system according to claim 9, wherein said determining means further includes a means for determining whether or not an identical data byte occurs at three or more even-ordered predecessor locations.

11. The data compressing system according to claim 7, wherein said data compressing system further includes a means for exiting said passing means when a preselected exit character is encountered within said data stream.

12. The data compressing system according to claim 7, wherein said data compressing system further includes a means for passing each byte of a subsequent data unit to an output, in response to a determination that an identical data byte does not occur at a pre-selected interval within a plurality of bytes already received.

13. A computer program product residing on a computer usable medium for compressing data, wherein each unit of said data is at least two bytes, said computer program product comprising:

computer code means for receiving a data stream;

computer code means for determining whether or not an identical data byte occurs at a pre-selected interval within a plurality of bytes already received, as each byte from said data stream is received; and computer code means for passing only a portion of a subsequent unit of data from said data stream to an output, in response to a determination that an identical data byte occurs at a pre-selected interval within a plurality of bytes already received.

14. The computer program product according to claim 13, wherein said each unit of said data is a UNICODE byte-pair.

15. The computer program product according to claim 13, wherein said computer code means for determining further includes a computer code means for determining whether or not an identical data byte occurs at an even-ordered predecessor location within a plurality of bytes already received.

16. The computer program product according to claim 15, wherein said computer code means for determining further includes a computer code means for determining whether or not an identical data byte occurs at three or more even-ordered predecessor locations.

17. The computer program product according to claim 13, wherein said computer program product further includes a program code means for exiting said program code means for passing when a preselected exit character is encountered within said data stream.

18. The computer program product according to claim 13, wherein said computer program product further includes a computer code means for passing each byte of a subsequent data unit to an output, in response to a determination that an identical data byte does not occur at a pre-selected interval within a plurality of bytes already received.

* * * * *